United States Patent [19]
Akimoto et al.

[11] Patent Number: 5,117,390
[45] Date of Patent: May 26, 1992

[54] SEMICONDUCTOR MEMORY SYSTEM FOR USE IN LOGIC LSI'S

[75] Inventors: Kazuhiro Akimoto, Tokorozawa; Katsumi Ogiue, Hinode; Takeo Uchiyama, Oume, all of Japan

[73] Assignee: Hitachi, Ltd., Tokyo, Japan

[21] Appl. No.: 659,230

[22] Filed: Feb. 22, 1991

Related U.S. Application Data

[63] Continuation of Ser. No. 351,044, May 10, 1989, Pat. No. 5,023,835, which is a continuation of Ser. No. 13,550, Feb. 11, 1987, abandoned.

[30] Foreign Application Priority Data

Feb. 19, 1986 [JP] Japan .................................. 61-32955

[51] Int. Cl.⁵ .................... G11C 7/00; G11C 11/411; G11C 11/415
[52] U.S. Cl. .................................. 365/155; 365/174; 365/190; 365/189.05; 365/239.08; 307/455
[58] Field of Search .................... 365/230.08, 189.04, 365/189.05, 225.6, 155, 230.06, 189.01, 230.03, 189.08, 174; 307/449, 455, 465, 494

[56] References Cited

U.S. PATENT DOCUMENTS

| | | | |
|---|---|---|---|
| 4,348,747 | 9/1982 | Takahashi | 365/230.08 |
| 4,575,824 | 3/1986 | Tanaka et al. | 365/230.08 X |
| 4,755,971 | 7/1988 | Jasmer et al. | 365/189.04 |
| 4,855,957 | 8/1989 | Nogami | 365/189.04 X |

*Primary Examiner*—Alyssa H. Bowler
*Attorney, Agent, or Firm*—Antonelli, Terry, Stout & Kraus

[57] ABSTRACT

A semiconductor memory system includes a memory section formed on a semiconductor substrate and having decode means for decoding an address signal, and a logic section formed on the semiconductor substrate and having address signal forming means for forming an address signal for the memory section and address signal delivering means for delivering the address signal for the memory section to the decode means. The address signal delivered from the address signal delivering means is defined by complementary signals.

4 Claims, 6 Drawing Sheets

SEMICONDUCTOR MEMORY SYSTEM FOR USE IN LOGIC LSI'S

This is a continuation of application Ser. No. 351,044, now U.S. Pat. No. 5,023,835, filed May 10, 1989, which is a continuation of application Ser. No. 013,550 filed Feb. 11, 1987, now abandoned.

BACKGROUND OF THE INVENTION

The present invention relates to a semiconductor integrated circuit technique and, more particularly, to a technique which may effectively be applied to logic LSI's (large-scale integration circuits), for example, a logic LSI having a RAM (random-access memory) as a main constituent element and logic circuits as peripheral elements.

When a system such as a computer is arranged by a combination of a general-purpose RAM and gate arrays, it is conventional practice to allow LSI's to exchange signals of ECL level having a relatively large amplitude or signal voltage, which is known as "ten K" (hereinafter referred to as "10k") or "hundred K" (hereinafter referred to as "100k").

In the case where a system such as a control storage of a computer is arranged using, for example, a RAM, a logic section L1 such as an address latch circuit may be connected to the input side of the RAM, and a logic section L2 such as an error correct circuit known as "ECC" or a signal select circuit may be connected to the output side of the RAM, as shown in FIG. 5. It should be noted that the RAM consists of an input buffer IB, an address decoder DEC, a MEMORY cell array MCARY, a sense gate SG, an output buffer OB, etc.

When such memory system is arranged, since conventional general-purpose RAM's have no peripheral logic circuits, the peripheral logic sections L1 and L2 must be arranged using logic LSI's such as gate arrays. Accordingly, signals which are exchanged between the logic section L1 and the RAM and between the logic section L2 and the RAM are set at an ECL level of 10k or 100k which is specified as a signal level between LSI's.

In such case, since the amplitude or signal voltage of the ECL level, i.e., 10k or 100k, is greater than that of signals employed inside the RAM and the gate arrays, it is necessary to respectively provide an output buffer OB involving a relatively large drive power and an input buffer IB having a level shift function at output and input ports of the RAM and the logic sections. Accordingly, the above-described memory system involves a considerably long delay in the input and output buffers.

On the other hand, it is desired to achieve an increased speed of the memory system of the type described above. However, the speed of signals employed inside the RAM and the gate arrays has already been increased to a considerable extent and almost reached the technical limit.

SUMMARY OF THE INVENTION

The present inventors, after exhaustive study, have found that it is difficult to increase the operating speed of a memory system with the above-described conventional arrangement which employs a general-purpose RAM.

Accordingly, it is an object of the present invention to achieve a high speed operation of a memory system employing a RAM as its main constituent element.

It is another object of the present invention to provide a semiconductor memory system which has a relatively simple logic function and yet enables a high-speed operation.

The above and other objects, novel features and advantages of the present invention will become more apparent from the following description of the preferred embodiments thereof, taken in conjunction with the accompanying drawings.

A representative of the novel techniques disclosed in this application will briefly be explained below.

Logic sections are disposed in the periphery of a memory circuit, and these circuits are fabricated on the same semiconductor chip in one unit wherein complementary signals are transferred between the logic sections and the memory circuit.

By virtue of the above-described arrangement, the amplitude or signal voltage of internal signals can be made smaller than that of external signals, and in particular, it is possible to omit the input buffer IB and the output buffer OB, which involve a disadvantageously long gate delay. Thus, it is possible to attain the above-described object of increasing the speed of a memory system.

DESCRIPTION OF THE PREFERRED EMBODIMENTS

Figure 1:
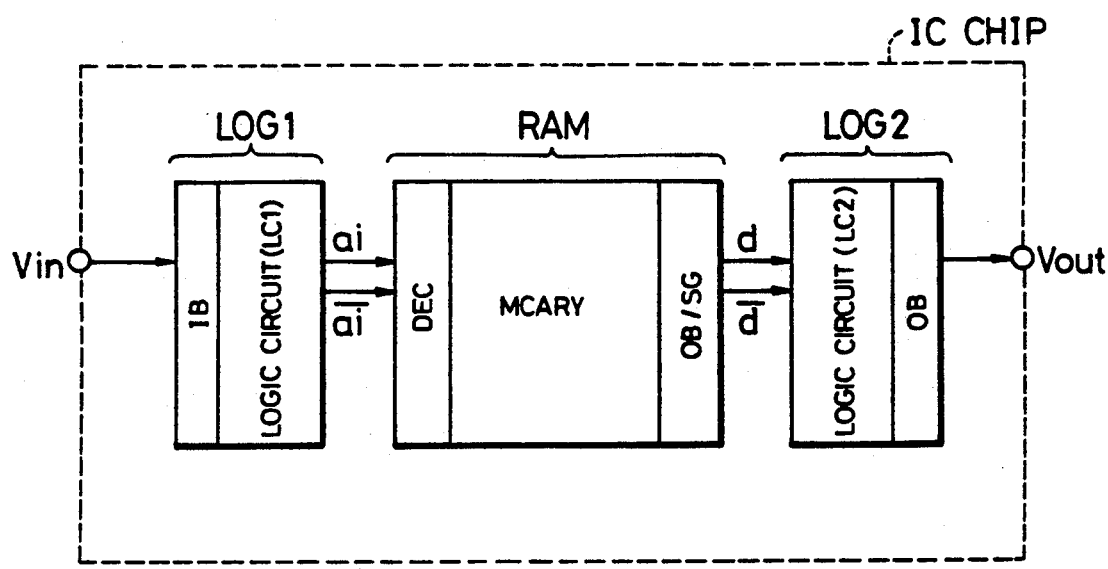
FIG. 1 is a block diagram showing one embodiment of the present invention in which the invention is applied to a memory system fabricated on a single chip as a one-chip memory.

Referring first to FIG. 1, there is shown one embodiment of the present invention in which the invention is applied to a memory system LSI fabricated on a single chip as a one-chip memory, the memory system having a RAM as its main constituent element and small sized logic sections in the periphery of the RAM.

Although not necessarily limitative, various circuit blocks surrounded by the chain line in FIG. 1 are fabricated on a single semiconductor chip IC CHIP such as a single crystal silicon substrate.

More specifically, a logic section LOG1 such as an address latch circuit is provided on the input side of the RAM, and a logic section LOG2 such as an error correct circuit or a signal select circuit is provided on the output side of the RAM. In this embodiment, the logic section LOG1 is provided with an input buffer IB alone which is supplied with an external signal Vin (an address Ai) of ECL 10k level, i.e., $-0.9$ to $-1.7$ V and forms a signal of small amplitude, i.e., $-1.6$ to $-2.2$ V, and the logic section LOG 1 has no output buffer. In other words, an output signal having a relatively small amplitude or signal voltage from the final stage of an internal logic circuit LC1 in the logic section LOG1 is supplied directly to the RAM. In this case, the signal which is output from the logic section LOG1 to the RAM is in the form of complementary signals ai and $\overline{ai}$.

Since the RAM is supplied with an address signal in the form of complementary signals from the logic section LOG1, the RAM needs no input buffer, and the complementary signals ai and $\overline{ai}$ supplied from the logic section LOG1 are input directly to a decoder circuit DEC. In response to the input complementary address signals, a data signal is read out from a memory cell array MCARY and output directly to the logic section LOG2 through a sense gate SG and a simplified output buffer OB. In this case, the read signal is output from the sense gate SG to the logic section LOG2 in the form of complementary signals d and $\overline{d}$.

Figure 5:
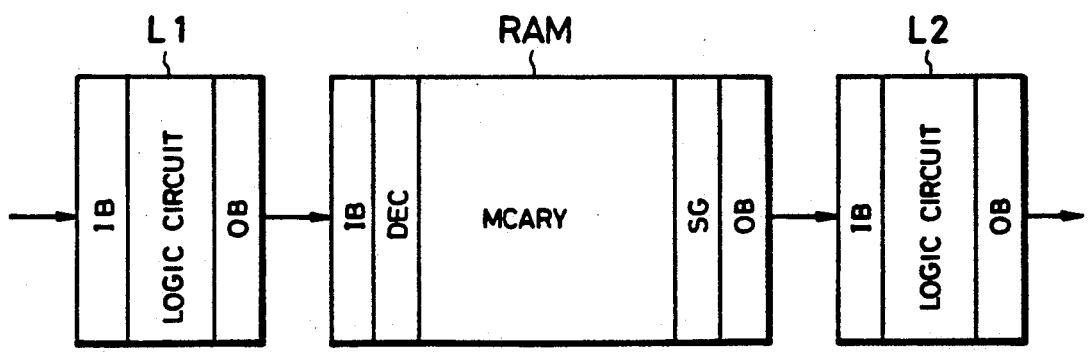
FIG. 5 is a block diagram showing the arrangement of one example of a conventional memory system.
Figure 2A:
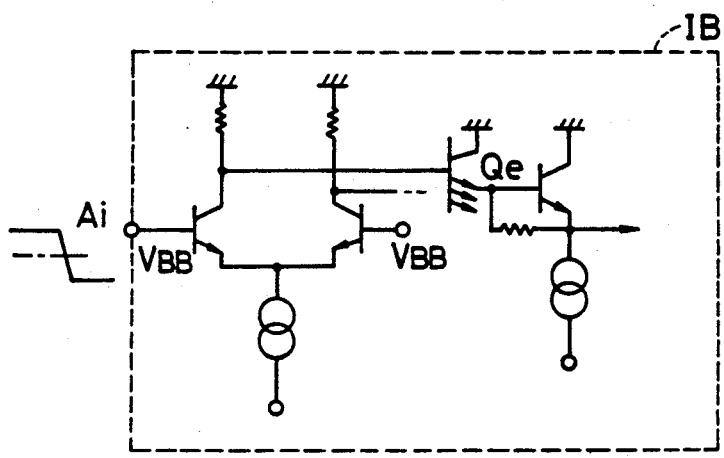
FIGS. 2A and 2B are circuit diagrams showing the difference between the arrangement of an input buffer of a RAM in a conventional memory system and that in a memory system according to the present invention.
Figure 2B:
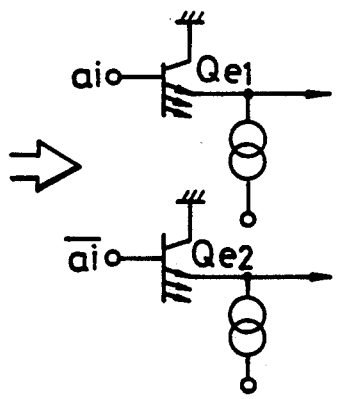

Accordingly, in the memory system in accordance with this embodiment, the input buffer IB, such as one that is shown in FIG. 2A, which is provided in the RAM of the conventional system (see FIG. 5) is simplified as shown in FIG. 2B. In other words, it becomes unnecessary to provide an input portion defined by an ECL circuit, and the complementary signals ai and $\overline{ai}$ from the logic circuit LC1 can be input directly to multiemitter transistors $Qe_1$, $Qe_2$....

As described above, in this embodiment an address signal which is supplied from the logic section LOG1 to the RAM and a data signal which is supplied from the RAM to the logic section LOG2 are each defined by complementary signals. Therefore, it is possible to reduce the amplitude or signal voltage of signals as compared that in the conventional system (see FIG. 5) wherein an address signal and a data signal are each transmitted through a single signal line. More specifically, in the case of a single signal, it is necessary to make a judgement as to whether the level of the signal is high or low on the basis of an absolute level such as a reference voltage $V_{BB}$ which is intermediate between the high and low levels. In contrast to this, in the case of complementary signals, the level thereof can be detected differentially.

Accordingly, for the noise of the same amplitude, a pair of complementary signals has an allowance double that in the case of a single signal. In consequence, it is also possible to reduce the signal amplitude or voltage. As a result, the speed in change of signals is raised and the delay in the circuit as a whole is reduced, so that the operating speed of the system is improved. It should be noted that, since in this embodiment the logic sections LOG1, LOG2 and the RAM are formed on the same chip, the number of output signal lines is not limited as in the case of a multichip system. Therefore, it is easy to realize transmission of signals in the form of complementary signals as described above.

Moreover, in this embodiment the load capacitance of input and output signal lines is relatively small since the logic sections LOG1, LOG2 and the RAM are formed on the same semiconductor chip. Accordingly, a circuit element which outputs complementary signals ai and $\overline{ai}$ does not need very large drive power. In consequence, the logic section LOG1 and the RAM need no output buffers and can output internal signals as they are, as described above.

Figure 3A:
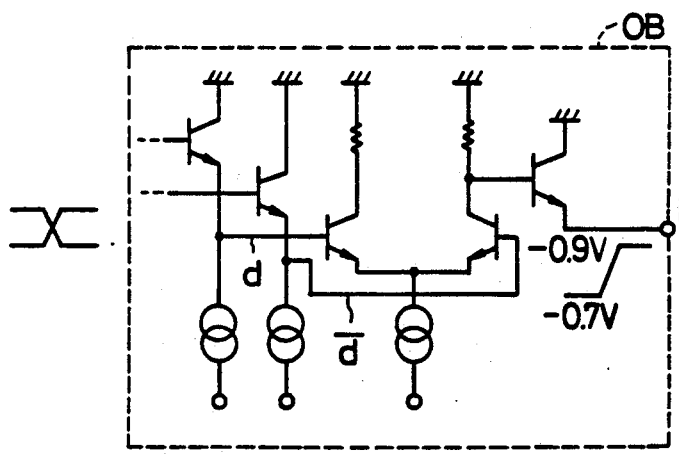
FIGS. 3A and 3B are circuit diagrams showing the difference between the arrangement of an output buffer of the RAM in the conventional memory system and that in the memory system according to the present invention.
Figure 3B:
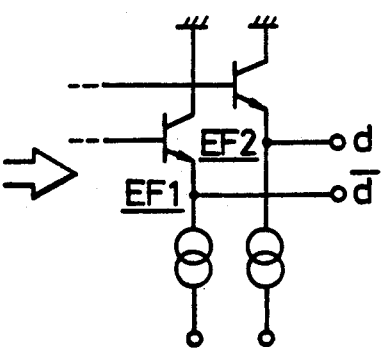

Accordingly, in the memory system in accordance with this embodiment, the output buffer OB, such as one that is shown in FIG. 3A, which is provided in the RAM of the conventional system is simplified as shown in FIG. 3B. In other words, the ECL circuit of the output buffer OB becomes unnecessary, and it becomes possible to deliver the output of the sense gate SG simply by passing it through emitter followers EF1 and EF2. In addition, since a data signal is supplied from the RAM to the logic section LOG2 while having an internal signal level which is smaller in amplitude or signal voltage than that of the external ECL level, it is unnecessary to provide an input buffer for level shift at the input port of the logic section LOG2.

As described above, in the memory system in accordance with this embodiment, the input and output buffers for transferring signals between the logic section LOG1 and the RAM and between the RAM and the logic section LOG2 are omitted or simplified. Accordingly, the signal transmission speed in the memory system is increased by an amount corresponding to the sum of gate delays which would otherwise be generated in the output buffer in the logic section LOG1, the input and output buffers in the RAM and the input buffer in the logic section LOG2, respectively. In particular, output buffers generally have relatively large element dimensions for the purpose of increasing the load driving capacity and therefore involve a relatively large gate delay. In this embodiment, however, the output buffer in the logic section LOG1 becomes unnecessary, and the output buffer of the RAM is simplified, so that the operating speed of the memory system is greatly increased.

Further, in this embodiment, each of the logic sections LOG1 and LOG2 is constituted by a gate array, although not necessarily limited thereto. Employment of a gate array to constitute a logic section in the periphery of the RAM enables, for example, an address latch circuit or an address increment circuit to be formed in the logic section LOG1 as in the case of the above-described embodiment. In addition, the block configuration of the memory may be changed by the logic sections LOG1 and LOG 2 so a to change a 4-bit output to an 8-bit output.

Thus, the RAM is allowed to be readily and effectively used by providing logic sections each constituted by a gate array in the periphery of the RAM and fabricating all the elements on the same chip. In addition, since the input and output buffers which are conventionally required between the circuit sections can be omitted, it is possible to increase the operating speed of the memory system.

Figure 4:
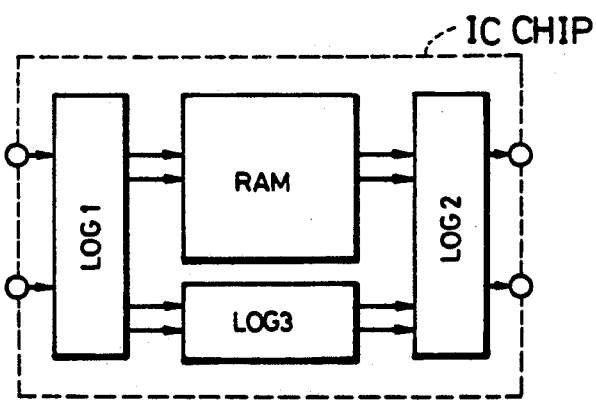
FIG. 4 is a block diagram showing the arrangement of another example of the memory system according to the present invention.

Although in the above-described embodiment the logic sections LOG1 and LOG2 are respectively provided on the input and output sides of the RAM, the arrangement may be such that a logic section is provided only on either the input or output side of the RAM, or the arrangement may be such that a logic section LOG3 is provided between the logic sections LOG1 and LOG2 so that the logic section LOG3 connects together the logic sections LOG1 and LOG2, as shown in FIG. 4.

Figure 6:
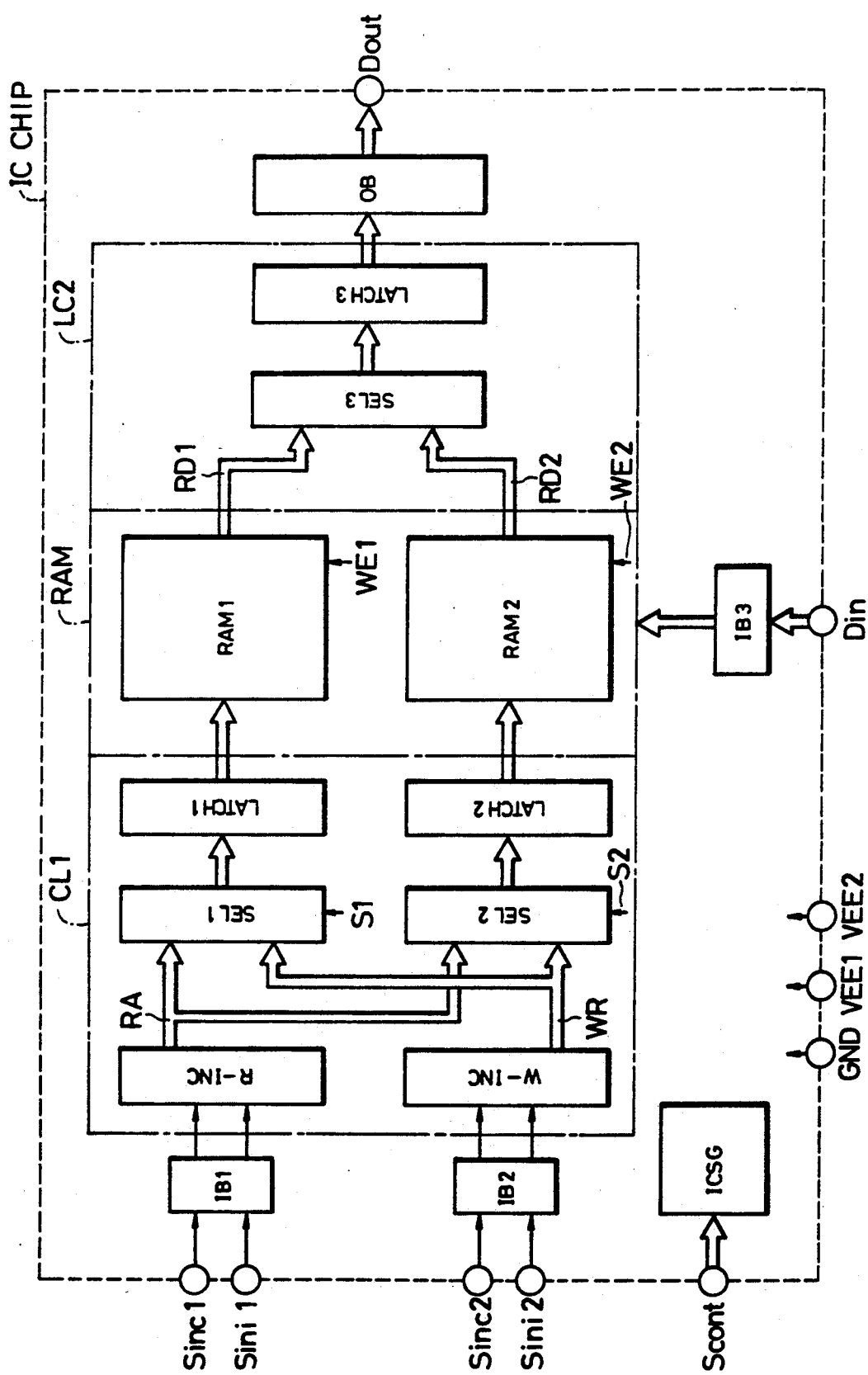
FIG. 6 is a block diagram showing another embodiment of the present invention in which the invention is applied to a memory system fabricated on a single chip as a one-chip memory.

FIG. 6 is a block diagram showing another embodiment of the present invention. All circuit blocks are formed on a signal semiconductor chip IC CHIP such as a single crystal silicon substrate. The semiconductor chip IC CHIP includes a RAM and logic circuits LC1 and LC2 which are respectively provided on the input and output sides of the RAM. The RAM includes a RAM1 and a RAM 2 which have the same arrangement as each other. The arrangement is such that it is possible to control a read operation in relation to one RAM while effecting control of a write operation in relation to the other RAM. Such function is suitable for a cache memory which is required to perform high-speed read and write operations.

The logic circuit LC1 is provided for supplying a read address and a write address to the RAM in response to a read address increment signal Sinc1 and a write address increment signal Sinc2 which are supplied to external terminals, respectively. The read and write increment signals Sinc1 and Sinc2 are respectively latched by input buffers IB1 and IB2, and the operations of a read address increment circuit R-INC and a write address increment circuit W-INC are controlled by the outputs of the input buffers IB1 and IB2, respectively. For example, in response to the high-level state of the increment signal Sinc1, the read address signal increment circuit R-INC outputs a read address signal RA while successively renewing it, and in response to the low-level state of the signal Sinc1, the read address signal increment circuit R-INC stops renewing the read address signal RA. To initialize the read address signal RA and the write address signal WA, a read address initialize signal Sini1 and a write address initialize signal Sini2 are supplied from external terminals, respectively. Select circuits SEL1 and SEL2 are provided for the RAM1 and RAM2, respectively, in order to select the read address signal RA or the write address signal WA and supply it to the RAM. When the read address signal RA is selected by the select circuit SEL1, the write address signal WA is selected by the select circuit SEL2. The select circuits SEL1 and SEL2 are respectively controlled by internal control signals S1 and S2. The selected address signals are simultaneously supplied to the RAM1 and the RAM2 through latch circuits LATCH1 and LATCH2, respectively.

The logic circuit LC2 includes a selector SEL3 for selectively supplying either one of the read data RD1 and RD2 which are respectively read out from the RAM1 and the RAM2 to an output latch circuit LATCH3. The read data RD1 or RD2 is delivered to the outside through an output buffer OB as output data Dout.

Write data Din which is to be written into the RAM1 or the RAM2 is applied thereto through an input buffer IB3. The write operations in relation to the RAM1 and the RAM2 are selectively controlled by write enable signals WE1 and WE2, respectively. Although not necessarily limitative, the control signals S1, S2, WE1 and WE2 are formed by an internal control signal generating circuit ICSG which is supplied with a control signal Scont. Further, power supply voltages VEE1 and VEE2 which are different in level from each other are supplied to this IC CHIP for the purpose of supplying an appropriate supply voltage in accordance with the difference in circuit configuration and of lowering the rate of power consumption.

Figure 7:
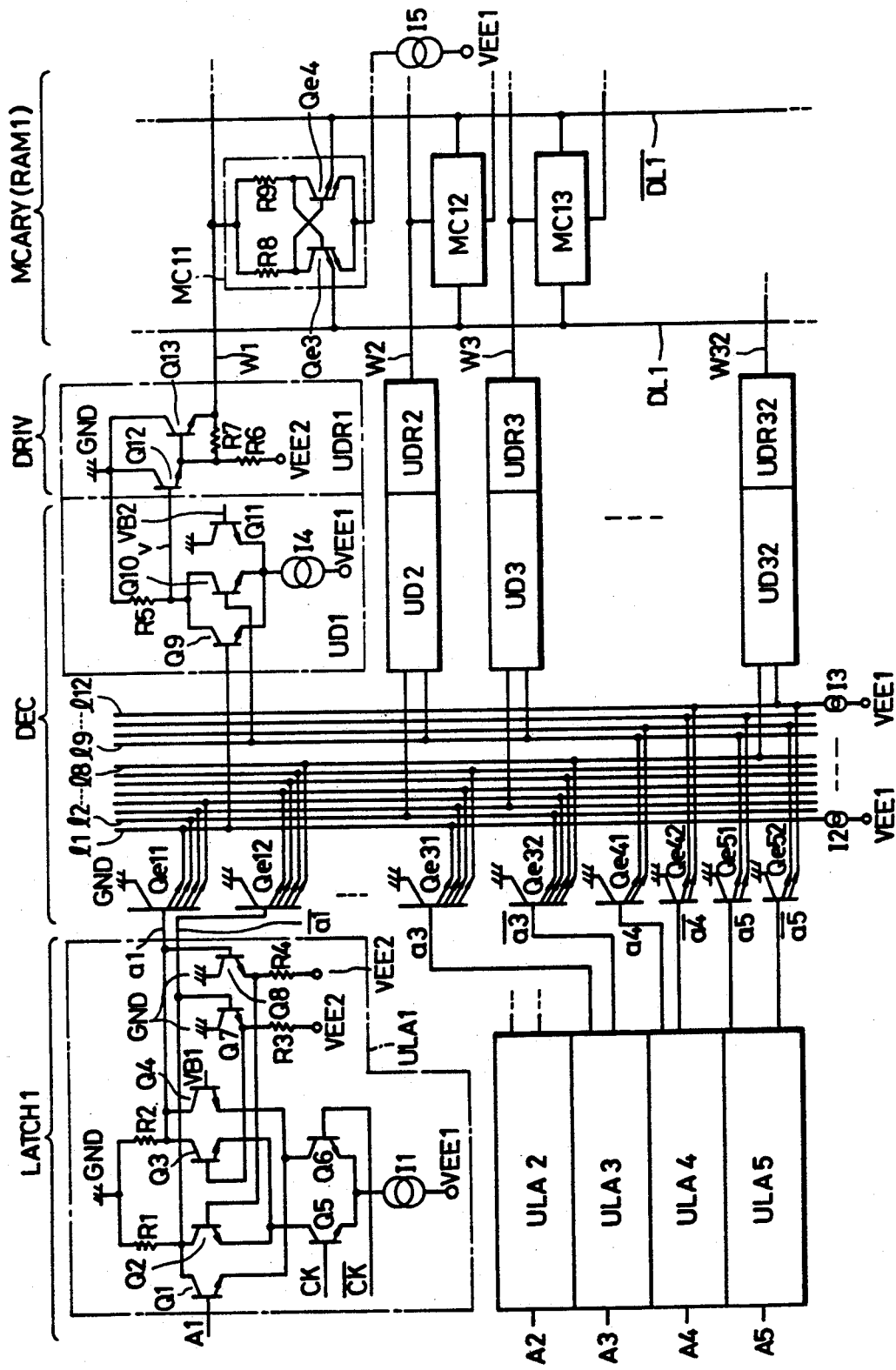
FIGS. 7 to 9 are circuit diagrams each showing a part of the memory system illustrated in FIG. 6.

FIG. 7 shows a practical circuit configuration of a part of the latch circuit LATCH1 and a part of the RAM1, which are shown in FIG. 6. In this embodiment, one of the 32 word lines W1 to W32 disposed in a memory cell array MCARY inside the RAM1 is selected on the basis of address signals A1 to A5 which are input to the latch circuit LATCH1, although the invention is not necessarily limited thereto. The latch circuit LATCH1 includes unit latch circuits ULA1 to ULA5 provided in correspondence with the address signals A1 to A5. Since the internal configurations of the unit latch circuits ULA1 to ULA5 are basically equal to each other, the unit latch circuit ULA1 alone will be explained below. The emitter of a transistor Q1 supplied at its base with the address signal A1 and the emitter of a transistor Q4 supplied at its base with a reference voltage VB1 are connected in common, whereby the transistors Q1 and Q4 define a differential transistor pair. Although in this embodiment the reference voltage VB1 is supplied to the base of the transistor Q4, a signal obtained by inverting the address signal A1 may be applied to said base. Transistors Q2 and Q3 and transistors Q5 and Q6 similarly define differential transistor pairs. Transistors Q5 and Q6 selectively supply the current from a constant-current source I1 to either the differential transistor pair (Q1 and Q4) or (Q2 and Q3) in response to complementary clock signals (CK and $\overline{CK}$). A transistor Q7 having an emitter resistor R3 and a transistor Q8 having an emitter resistor R4 are provided in order to cross-connect the inputs and outputs of the differential transistor pair (Q2 and Q3). More specifically, output signals a1 and a1 which are respectively formed between the collectors of the differential transistor pair (Q2, Q3) and collector resistors R1, R2 are fed back to the respective bases of the differential transistor pair (Q2 and Q3), thus constituting a latch circuit. When the differential transistor pair (Q2 and Q3) is in an operative state, the differential transistor pair (Q1 and Q4) is in an inoperative state, and a write operation based on the address signal A1 is therefore inhibited. Conversely, when the differential transistor pair (Q2 and Q3) is in an inoperative state, the differential transistor pair (Q1 and Q4) is in an operative state, and a write operation based on the address signal A1 is therefore carried out. It should be noted that the power supply voltage VEE1 is for example −5.2 V, while the power supply voltage VEE2 is −1.8 V.

The RAM is directly supplied with complementary address signals a1, a1, a2, a2; ... a5, a5 which are respectively output from the unit latch circuits ULA1 and ULA5. Accordingly, it is unnecessary to provide on the input side of an address decoder DEC inside the RAM an address buffer for forming complementary address signals required for the address decoder DEC. Thus, it is possible to achieve a high-speed operation of the memory system.

Multiemitter transistors Qe11, Qe12, ... Qe32 are provided in order to selectively shift only one of the signal lines l1 to l8 to a low level on the basis of the complementary address signals a1, a1; a2, a2; and a3, a3. More specifically, combinations of emitter outputs of the multiemitter transistors Qe11, Qe12, ... Qe32 are made by connection between the respective emitters and the signal lines l1 to l8, so that there is one combination of emitters which provides a low level. Similarly, multiemitter transistors Qe41 to Qe52 are provided in order to selectively shift only one of the signal lines l9 to l12 on the basis of the complementary address signals a4, a4; and a5, a5. There are 32 combinations between each of the signal lines l1 to l8 and each of the signal lines 19 to 112. Unit detector circuits UD1 to UD32 are provided for the purpose of detecting a combination of signal lines in which combination both signal lines are at the low level. Since the internal configurations of the unit detector circuits UD1 to UD32 are basically equal to each other, the unit detector circuit UD1 alone will be explained below. A NAND circuit is constituted by transistors Q9, Q10 and a collector resistor R5 which is connected these transistors in common. When at least one of the base input signals of the transistors Q9 and Q10 is at the high level, the supply current is supplied through the transistor which is ON, the resistor R5 and a constant-current source I4. In consequence, the output voltage is shifted to the low level by the voltage drop caused by the resistor R5. When both the base input signals of the transistors Q9 and Q10 are at the low level, only a transistor Q11 which is supplied at its base with a reference voltage VB2 is turned ON, and the supply current flows through the transistor Q11 and the constant-current source I4 alone. In consequence, the output voltage v is raised to the high level. The output voltage v is supplied to a word line through a word line drive DRIV. The word driver DRIV includes unit word line drivers UDR1 to UDR32 provided in correspondence with word lines W1 to W32, respectively. The unit word line driver UDR1 is constituted by Darlington-connected transistors Q12, Q13 and emitter resistors R6, R7.

The memory cell array MCARY includes memory cells MC11, MC12 ... which are respectively provided at the intersections between a pair of data lines (CL1 and DL1) and the word lines W1, W2 .... The memory cells have the same arrangement as each other. For example, the memory cell MC11 includes multiemitter transistors Qe3, Qe4 which are cross-connected at their bases and collectors, and load resistors R8, R9. In order to hold memory cell information, the memory cells are connected to a hold current source I5.

Figure 8:
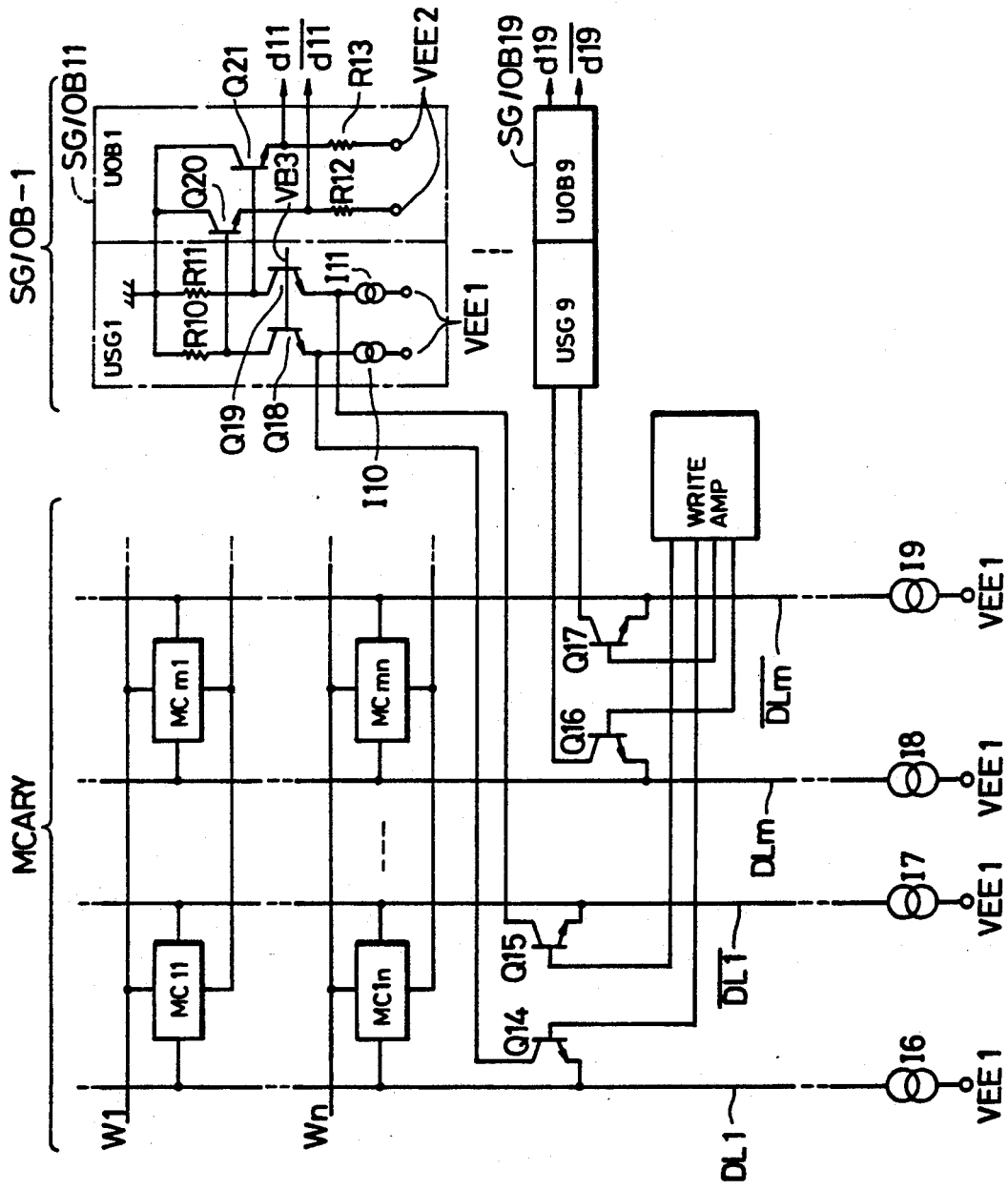

FIG. 8 shows the memory cell array MCARY, a sense gate and output buffer SG/OB-1 which are provided inside the RAM1. As also partially shown in FIG. 7, the memory cell array MCARY includes memory cells MC11 to MCmn which are respectively provided at the intersections between word lines W1 to Wn and pairs of data lines (DL1, DL1) to (DLm, $\overline{DLm}$). Pairs of transistors (Q14, Q15) and (Q16, Q17) which are provided in correspondence with the pairs of data lines (DL1, DL1) and (DLm, $\overline{DLn}$), respectively, are adapted to effect reading and writing of data in relation to memory cells which belong to each pair of data lines. For example, the emitters of the pair of cross-connected transistors (not shown) in the memory cell MC11 are connected to the emitters of the pair of transistors Q14, Q15 in common, and the common emitters are respectively connected to constant-current sources I6 and I7. Pairs of bases of the transistor pairs (Q14, Q15) and (Q16, Q17) are supplied with a reference voltage or a write voltage from a WRITE AMP, and pairs of collectors of these transistors are respectively connected to unit sense gates USG1 and USG9. The unit sense gate USG1 converts collector currents of the pair of transistors (Q14 and Q15), which perform a complementary operation in reading data, into complementary voltages and delivers them to a unit output buffer UOB1 connected to the output side thereof. Current sources I10 and I11 are respectively provided for the emitters of transistors Q18 and Q19 which are supplied with a common base reference voltage VB3, and collector resistors R10 and R11 for forming output voltages are provided for the respective collectors of the transistors Q18 and Q19. The unit output buffer UOB1 is defined by an impedance transformer circuit consisting of transistors Q20, Q21 and resistors R12, R13 and forms complementary output signals d11 and d11. The RAM1 is provided with nine unit output buffers UOB1 to UOB9 for the purpose of simultaneously outputting 9-bit data items, thus forming complementary output signals d11, d11 to d19, d19.

According to this embodiment, since the output of the RAM1 is delivered in the form of complementary signals, it is unnecessary to provide an ECC circuit for converting complementary signals into a single signal. Accordingly, the arrangement of each of the unit output buffers UOB1 to UOB9 is simplified, and the delay in the output circuits is shortened. Further, since the complementary output signals d11, d11 to d19, d19 are supplied to logic circuits formed in the same chip as the RAM1, the load capacitance and influence of noise are small as compared with the arrangement in which such output signals are supplied to outside of the chip. Accordingly, no large driving capacity is needed, and a relatively small signal amplitude or voltage suffices. Thus, it is possible to reduce the rate of power consumption. According to this embodiment, the output buffer is driven by a relatively small supply voltage VEE2.

Figure 9:
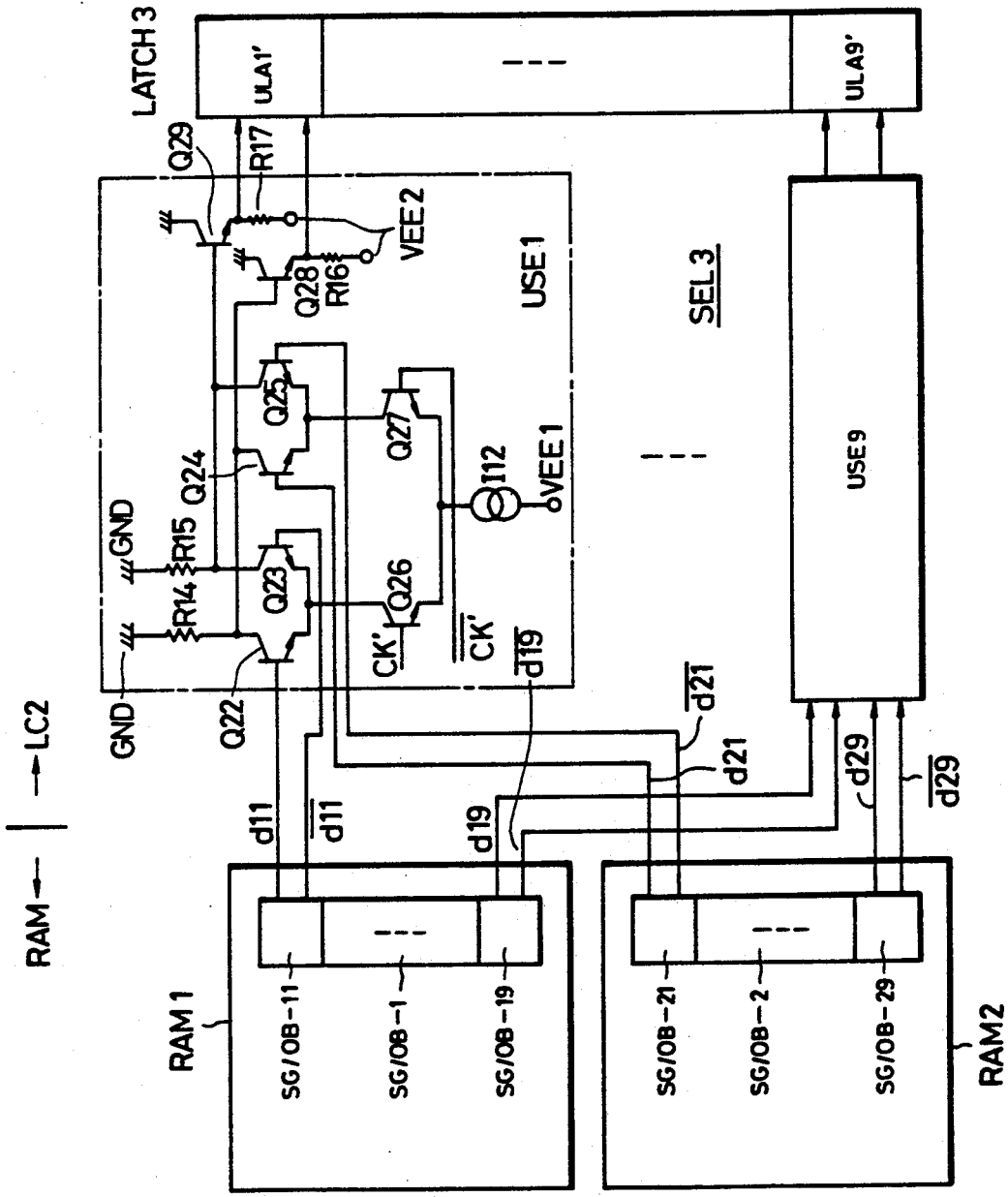

FIG. 9 shows the connection relationship between the RAM and the select circuit SEL3 which are shown in FIG. 6. The select circuit SEL3 is provided in order to select one of the output signal lines in either the sense gate and output buffer SG/OB1 in the RAM1 or the sense gate and output buffer SG/OB2 in the RAM2 and to deliver a signal on the selected output signal line to the output latch circuit LATCH3. Nine unit select circuits USE1 to USE9 are provided in correspondence with complementary output signals d11, d11 to d19, d19 from sense gate and output buffers SG/OB-11 to SG/OB-19 and complementary output signals d21, d21 to d29, d29 from sense gate and output buffers SG/OB-21 to SG/OB-29. Each unit select circuit has two differential transistor pairs (Q22, Q23) and (Q24, Q25) for respectively receiving two pairs of complementary signals d11, d11 and d21, d21, as representatively shown by the unit select circuit USE1. In order to selectively operate either one of the two differential transistor pairs, the current from a constant-current source I12 is selectively supplied thereto through a differential transistor pair (Q26, Q27). For example, if the base signal CK' of the transistor Q26 is at the high level, the differential transistor pair (Q22 and Q23) is brought into an operative state, and therefore complementary signals corresponding to the complementary output signals d11 and d11 respectively appear at one end of a common collector resistor R14 and one end of a common collector resistor R15. Conversely, if the base signal CK' of the transistor Q27 is at the high level, the differential transistor pair (Q24 and Q25) are brought into an operative state, and therefore complementary signals corresponding to the complementary output signals d21 and d21 respectively appear said ends of the common collector resistors R14 and R15. In this way, the select operation is controlled in response to the signals CK' and CK'. An impedance transformer means which is constituted by, for example, transistors Q28, Q29 and emitter resistors R16, R17 is provided at the output port of each of the unit select circuits USE1 to USE9, and output complementary signals of each impedance transformer means is delivered to the corresponding one of the unit output latch circuits ULA1' to ULA9'.

The present invention, arranged as detailed above, provides the following advantages:

(1) As described above, logic sections each defined by, e.g., a gate array are disposed in the periphery of a memory circuit, and all the constituent elements are fabricated on the same semiconductor chip in one unit. In addition, complementary signals are transferred between the logic sections and the memory. Therefore, the amplitude or signal voltage of internal signals can be made smaller than that of external signals, so that it is possible to increase the speed in change of the signals. In addition, since it is possible to omit input and output buffers which are conventionally needed at input and output ports of a RAM and logic sections and which involve a disadvantageously long gate delay, the operating speed of the memory system can be increased.

(2) Since logic sections each defined by, e.g., a gate array are disposed in the periphery of a memory circuit, and all the constituent elements are fabricated on the same semiconductor chip in one unit, the logic sections enable addition of logic functions required for efficient access to the memory, so that the function of the memory is greatly improved and it becomes easy to handle the memory.

Although the invention accomplished by the present inventors has been practically described by way of embodiments, it should be noted here that the described embodiments are not necessarily exclusive, and various changes and modifications may, of course, be imparted thereto without departing from the spirit and scope of the invention. For example, although in the above-described embodiments the present invention is applied to a memory system which employs a bipolar-type RAM as its main constituent element, the invention may also be applied to a memory system which employs as its main element a RAM or a ROM (read-only memory) constituted by MOSFET's and has logic sections in the periphery of such memory.

In the above description, the invention accomplished by the present inventors is applied to a memory system consisting of a memory and logic sections which is a background art of the present invention. However, the present invention is not necessarily limitative thereto and may also be utilized to integrally fabricate a logic LSI, which has heretofore been split into a plurality of sections, on a single chip or in a signal package as a module.

What is claimed is:

1. A memory system formed on a single semiconductor substrate comprising:

first and second memory blocks each having output means for outputting a pair of complementary signals read out from a memory cell in said memory system;

a latch circuit for delivering address signals to said first and second memory blocks;

a logic section coupled to receive pairs of complementary signals from said first and second memory blocks for carrying out a logical processing operation in response to said pairs of complementary signals; and a plurality of pairs of first and second lines each respectively coupled between said first and second memory blocks and said logic section for transmitting said pairs of complementary signals, wherein said logic section includes a selecting circuit having a first bipolar transistor having a base coupled to receive one signal of a first pair of complementary signals from said first memory block, a second bipolar transistor having a base coupled to receive the other signal of said first pair of complementary signals from said first memory block, a third bipolar transistor having a base coupled to receive one signal of a second pair of complementary signals from said second memory block, a fourth bipolar transistor having a base coupled to receive the other signal of said second pair of complementary signals from said second memory block, a fifth bipolar transistor coupled to both emitters of said first and second bipolar transistors, and a sixth bipolar transistor coupled to both emitters of said third and fourth bipolar transistors, and wherein said fifth and sixth bipolar transistors form a differential circuit having their emitters coupled to one another and to a constant current source, and wherein said fifth and sixth bipolar transistors have their bases respectively coupled to receive complementary clock signals.

2. A memory system according to claim 1, wherein the collectors of said first and third bipolar transistors are coupled to provide a first output signal of said selecting circuit, and wherein the collectors of said second and fourth bipolar transistors are coupled to provide a second output signal of said selecting circuit.

3. A memory system according to claim 2, wherein said logic section further includes a latch circuit coupled to receive said first and second output signals of said selecting circuit.

4. A memory system according to claim 3, wherein said selecting circuit further includes a first emitter follower circuit having a base coupled to the collectors of the first and third bipolar transistors and an emitter coupled to said latch circuit, and a second emitter follower circuit having a base coupled to the collectors of the second and fourth bipolar transistors and an emitter coupled to said latch circuit, such that the first output signal of the selecting means is provided at the emitter of the first emitter follower circuit and the second output signal of the selecting means is provided at the emitter of the second emitter follower circuit.

* * * * *